(12) United States Patent
Byeon et al.

(10) Patent No.: US 12,363,902 B2
(45) Date of Patent: Jul. 15, 2025

(54) VERTICAL SEMICONDUCTOR DEVICE AND METHOD FOR FABRICATING THE SAME

(71) Applicant: SK hynix Inc., Icheon-si Gyeonggi-do (KR)

(72) Inventors: Hye-Hyeon Byeon, Icheon-si Gyeonggi-do (KR); Sang-Deok Kim, Seongnam-si Gyeonggi-do (KR); Il-Young Kwon, Seoul (KR); Tae-Hong Gwon, Icheon-si Gyeonggi-do (KR); Jin-Ho Bin, Hanam-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 21 days.

(21) Appl. No.: 18/403,470

(22) Filed: Jan. 3, 2024

(65) Prior Publication Data

US 2024/0155839 A1 May 9, 2024

Related U.S. Application Data

(63) Continuation of application No. 17/848,963, filed on Jun. 24, 2022, now Pat. No. 11,903,209, which is a
(Continued)

(30) Foreign Application Priority Data

Jul. 26, 2019 (KR) .................. 10-2019-0091116

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02164* (2013.01); *H01L 21/0217* (2013.01);
(Continued)

(58) Field of Classification Search
CPC .................................................... H10B 43/27
(Continued)

(56) References Cited

U.S. PATENT DOCUMENTS 5,693,562 A 12/1997 Tseng
7,780,865 B2 8/2010 Balseanu et al.
(Continued)

FOREIGN PATENT DOCUMENTS

CN 101431047 A 5/2009
CN 105226066 A 1/2016
(Continued)

*Primary Examiner* — Hsin Yi Hsieh
(74) *Attorney, Agent, or Firm* — WILLIAM PARK & ASSOCIATES LTD.

(57) ABSTRACT

A vertical semiconductor device and a method for fabricating the same may include forming an alternating stack of dielectric layers and sacrificial layers over a lower structure, forming an opening by etching the alternating stack, forming a non-conformal blocking layer on the alternating stack in which the opening is formed, adsorbing a deposition inhibitor on a surface of the blocking layer to convert the non-conformal blocking layer into a conformal blocking layer on which the deposition inhibitor is adsorbed, and forming a charge storage layer on the conformal blocking layer.

20 Claims, 23 Drawing Sheets

Related U.S. Application Data continuation of application No. 16/705,728, filed on Dec. 6, 2019, now Pat. No. 11,404,432.

(51) Int. Cl.
  *H01L 21/311* (2006.01)
  *H10D 30/01* (2025.01)
  *H10D 64/01* (2025.01)

(52) U.S. Cl.
  CPC .. *H01L 21/02178* (2013.01); *H01L 21/02315* (2013.01); *H01L 21/02636* (2013.01); *H01L 21/31116* (2013.01); *H10D 30/0413* (2025.01); *H10D 64/037* (2025.01)

(58) Field of Classification Search
  USPC .......................................................... 438/268
  See application file for complete search history.

(56) References Cited

U.S. PATENT DOCUMENTS

| | | |
|---|---|---|
| 9,478,495 B1 | 10/2016 | Pachamuthu et al. |
| 2003/0129828 A1 | 7/2003 | Cohen |
| 2007/0141779 A1 | 6/2007 | Abelson et al. |
| 2012/0018851 A1 | 1/2012 | Farooq et al. |
| 2012/0156848 A1 | 6/2012 | Yang et al. |
| 2014/0073128 A1 | 3/2014 | Jong |
| 2016/0343657 A1* | 11/2016 | Sawa ..................... H10B 43/27 |
| 2017/0125548 A1 | 5/2017 | Hung et al. |
| 2019/0131126 A1 | 5/2019 | Ko et al. |
| 2022/0069218 A1 | 3/2022 | Yoon et al. |

FOREIGN PATENT DOCUMENTS

| | | |
|---|---|---|
| CN | 109524414 A | 3/2019 |
| CN | 110021554 A | 7/2019 |

* cited by examiner

VERTICAL SEMICONDUCTOR DEVICE AND METHOD FOR FABRICATING THE SAME

CROSS-REFERENCE TO RELATED APPLICATIONS

The present application is a continuation application of U.S. patent application Ser. No. 17/848,963, filed on Jun. 24, 2022, which is a continuation application of U.S. patent application Ser. No. 16/705,728, filed on Dec. 6, 2019, and claims priority under 35 U.S.C 119(a) to Korean Patent Application No. 10-2019-0091116, filed on Jul. 26, 2019, in the Korean Intellectual Property Office, which is incorporated herein by reference in its entirety.

BACKGROUND

1. Field

Embodiments relate to a semiconductor device, and more particularly, to a vertical semiconductor device and a method for fabricating the same.

2. Description of the Related Art

A semiconductor device may include a memory cell array including a plurality of memory cells. The memory cell array may include memory cells arranged in various structures. In order to improve the degree of integration of the semiconductor device, memory cells may be arranged in three dimensions on a substrate.

SUMMARY

Exemplary embodiments of the present teachings are directed to a vertical semiconductor device capable of improved reliability and a method for fabricating the same.

In accordance with an embodiment, a method for fabricating a vertical semiconductor device may include: forming an alternating stack of dielectric layers and sacrificial layers over a lower structure; forming an opening by etching the alternating stack; forming a non-conformal blocking layer on the alternating stack in which the opening is formed; adsorbing a deposition inhibitor on a surface of the blocking layer to convert the non-conformal blocking layer into a conformal blocking layer on which the deposition inhibitor is adsorbed; and forming a charge storage layer on the conformal blocking layer.

In accordance with an embodiment, a method for fabricating a vertical semiconductor device may include: forming an alternating stack of dielectric layers and sacrificial layers over on a lower structure; forming an opening by etching the alternating stack; forming a non-conformal blocking layer on the alternating stack in which the opening is formed; adsorbing a first deposition inhibitor on a surface of the blocking layer to convert the non-conformal blocking layer into a conformal blocking layer; forming a charge storage layer on the conformal blocking layer on which the first deposition inhibitor is adsorbed; and adsorbing a second deposition inhibitor on a surface of the charge storage layer.

In accordance with an embodiment, a vertical semiconductor device may include: a lower structure; an alternating stack of dielectric layers and gate electrodes formed over the lower structure; an opening penetrating the alternating stack; a blocking layer formed on a sidewall of the opening; a charge storage layer formed on a sidewall of the blocking layer; and an adsorption layer formed at an interface between the blocking layer and the charge storage layer.

DETAILED DESCRIPTION

Various examples and embodiments described herein are described with reference to cross-sectional views, plan views, and block diagrams, which represent schematic views of the present teachings. Thus, the shape of the illustrations may be modified by fabricating techniques and/or tolerances. Accordingly, the embodiments of the present teachings are not limited to the specific forms shown, but also include changes in the shapes that are generated according to the fabricating process. The regions illustrated in the figures have schematic attributes, and the shapes of the regions illustrated in the figures are intended to illustrate specific types of regions of the elements and are not intended to limit the scope of the present teachings.

Figure 1:
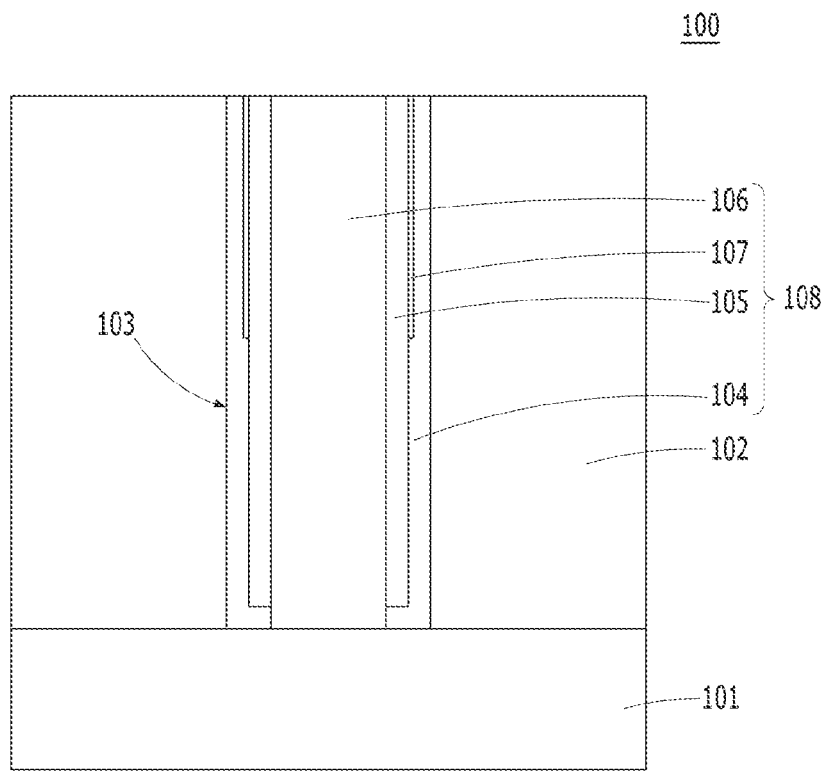
FIG. 1 is a cross-sectional view illustrating a semiconductor device in accordance with an embodiment.

FIG. 1 is a cross-sectional view illustrating a semiconductor device 100 in accordance with an embodiment.

Referring to FIG. 1, the semiconductor device 100 may include a substrate 101, a mold layer 102 on the substrate 101, an opening 103 formed in the mold layer 102, and a gap-fill structure 108 filling the opening 103. The gap-fill structure 108 may include a first liner layer 104 formed on the sidewall of the opening 103, a second liner layer 105 formed on the sidewall of the first liner layer 104, and a filler 106 filling the opening 103 on the second liner layer 105. The gap-fill structure 108 may further include an adsorption layer 107 formed at an interface between the first liner layer 104 and the second liner layer 105.

The adsorption layer 107 may be located at the top sidewall and top corner of the opening 103. The adsorption layer 107 may include a material that induces conformal deposition of the first liner layer 104 and the second liner layer 105. The adsorption layer 107 may include a deposition inhibitor. The deposition inhibitor may include fluorine. The deposition inhibitor may include Cl, $N_2$, or HF other than fluorine.

The first liner layer 104 may include oxide, and the second liner layer 105 may include nitride. The first liner layer 104 may include silicon oxide, and the second liner layer 105 may include silicon nitride. The adsorption layer 107 may include fluorine-adsorbed oxide or fluorine-adsorbed nitride. The adsorption layer 107 may include fluorine-adsorbed silicon oxide or fluorine-adsorbed silicon nitride.

In the present embodiment, when the first liner layer 104 and the second liner layer 105 include silicon oxide and silicon nitride, respectively, the adsorption layer 107 may include fluorine-adsorbed silicon oxide. Herein, the adsorption layer 107 may induce conformal deposition of silicon nitride, which is the second liner layer 105.

In some embodiments, when the first liner layer 104 and the second liner layer 105 include silicon nitride and silicon oxide, respectively, the adsorption layer 107 may include fluorine-adsorbed silicon nitride. Herein, the adsorption layer 107 may induce conformal deposition of silicon oxide, which is the second liner layer 105.

The filler 106 of the gap-fill structure 108 may include oxide, a silicon layer, a high-k material, or combinations thereof. The filler 106 may include silicon oxide, a polysilicon layer, aluminum oxide, or combinations thereof.

The mold layer 102 may include a dielectric material, a conductive material, or a combination thereof. The mold layer 102 may include oxide, nitride, a metal, metal nitride, metal silicide, metal carbide, amorphous silicon, polysilicon, amorphous carbon, silicon oxynitride, or combinations thereof.

FIGS. 2A to 2G are cross-sectional views illustrating a method for fabricating a semiconductor device in accordance with an embodiment.

Figure 2A:
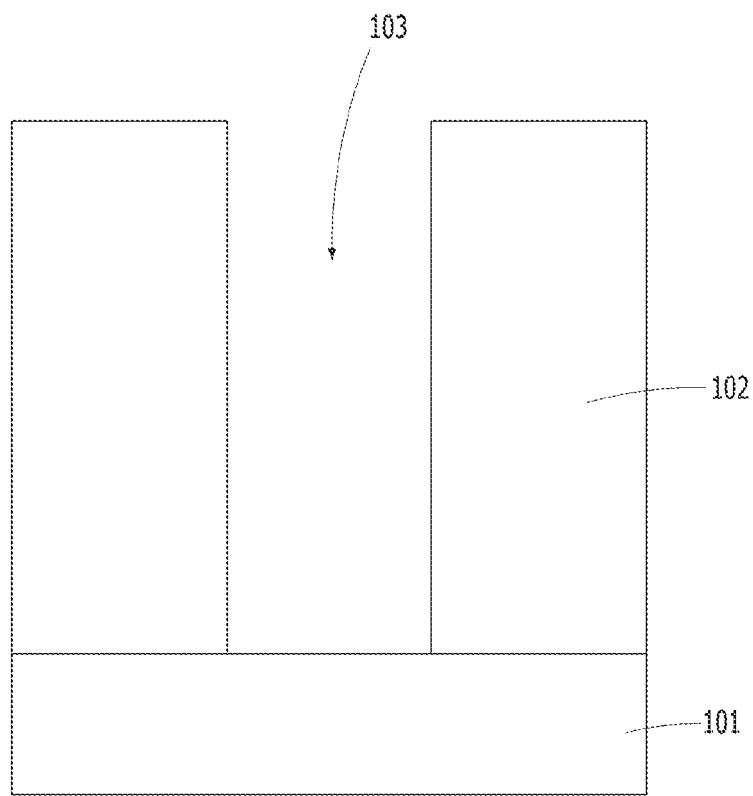
FIGS. 2A to 2G are cross-sectional views illustrating a method for fabricating a semiconductor device in accordance with an embodiment.

As illustrated in FIG. 2A, a mold layer 102 may be formed on a substrate 101. The substrate 101 may be a material suitable for semiconductor processing. The substrate 101 may include a semiconductor substrate. For example, the substrate 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, combinations thereof, or multi-layers thereof. The substrate 101 may include another semiconductor material, such as germanium. The substrate 101 may include a III/V-group semiconductor substrate, for example, a chemical compound semiconductor substrate such as a gallium arsenide (GaAs). The substrate 101 may include a Silicon-On-Insulator (SOI) substrate.

The mold layer 102 may include a dielectric material, a conductive material, or a combination thereof. The mold layer 102 may include oxide, nitride, a metal, metal nitride, metal silicide, metal carbide, amorphous silicon, polysilicon, amorphous carbon, silicon oxynitride, or combinations thereof.

Subsequently, an opening 103 may be formed. The opening 103 may be formed in the mold layer 102. A part of the mold layer 102 may be etched using a mask (not illustrated) to form the opening 103. The bottom of the opening 103 may expose the surface of the substrate 101. The opening 103 may include a vertical hole. A plurality of openings 103 may be arrayed. The plurality of openings 103 may be arranged in a zigzag pattern. The plurality of openings 103 may have uniform sizes. Each of the openings 103 may be referred to as a "contact hole", a "via hole", or a "vertical hole".

The sidewalls of the opening 103 may have vertical profiles. In some embodiments, the sidewalls of the opening 103 may have sloped profiles.

Figure 2B:
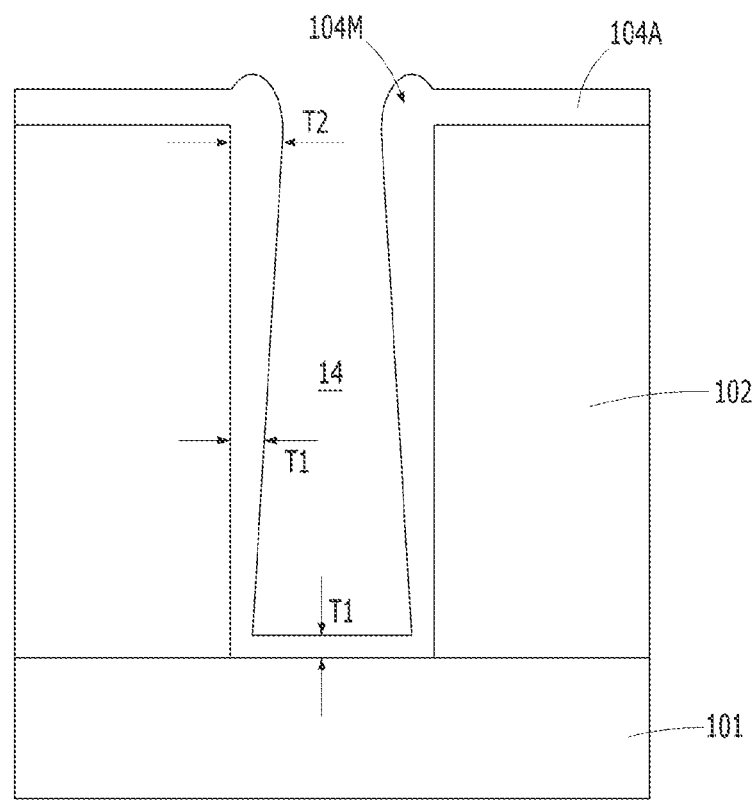

As illustrated in FIG. 2B, a first liner layer 104A may be formed. The first liner layer 104A may be non-conformally formed. In other words, the first liner layer 104A may have poor step coverage due to a high aspect ratio of the opening 103.

The first liner layer 104A may have different thicknesses, that is, a first thickness T1 formed on the sidewalls and the bottom of the opening 103 and a second thickness T2 formed at the top corners of the opening 103. For example, the second thickness T2 may be larger than the first thickness T1. Due to the thickness difference, an overhang shape 104M may be formed at the top corners of the opening 103.

Figure 2C:
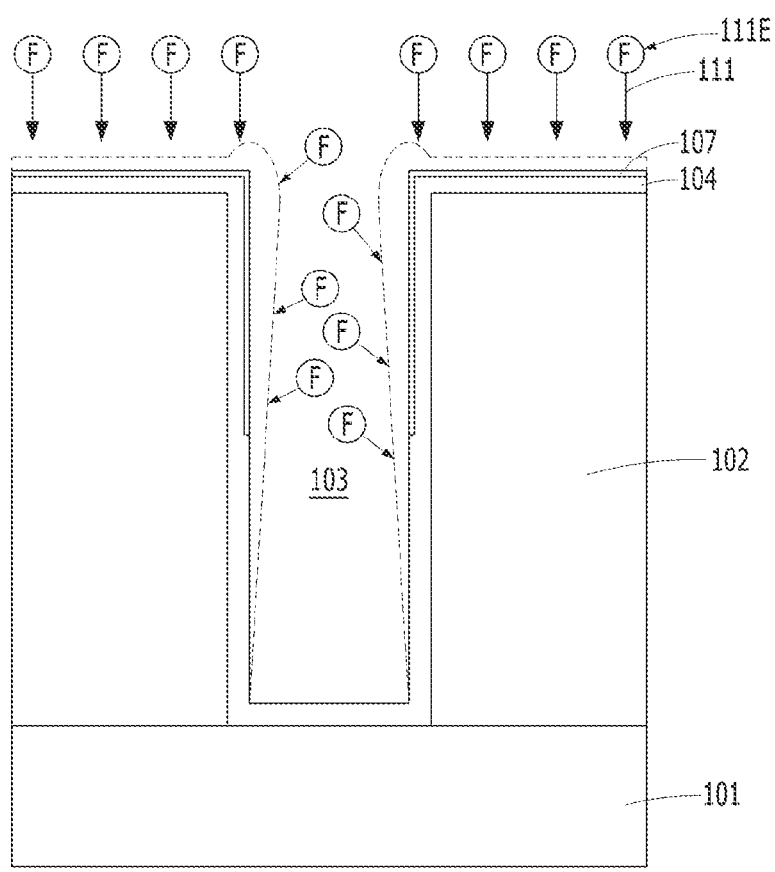

As illustrated in FIG. 2C, surface treatment 111 may be performed. The surface treatment 111 may include plasma treatment. The surface treatment 111 may convert the surface profile of the first liner layer 104A. For example, the surface treatment 111 may convert the non-conformal surface of the first liner layer 104A into a conformal surface. The conformal surface may refer to having a uniform thickness along the lower profile.

The surface treatment 111 may include an etch species 111E. The etch species 111E may include a material capable of partially etching the surface of the first liner layer 104A. The etch species 111E may include fluorine (F). The surface treatment 111 may include an $NF_3$ plasma treatment. Accordingly, the surface treatment 111 may include a fluorine plasma treatment.

As described above, the first liner layer 104A may be etched at the top corners of the opening 103 by the surface treatment 111 using fluorine plasma. In addition, the first liner layer 104A may be etched in the middle and bottom of the opening 103. At this time, the first liner layer 104A may be mainly etched at the top corners of the opening 103, and thus the overhang shape 104M may be removed.

Consequently, a first liner layer 104 having a uniform thickness may be formed by the surface treatment 111.

Fluorine of the fluorine plasma used during the surface treatment 111 may be adsorbed on the surface of the first liner layer 104. A fluorine adsorption layer 107 may be partially formed on the surface of the first liner layer 104. The fluorine adsorption layer 107 may serve as a deposition inhibitor in a subsequent process.

Figure 2D:
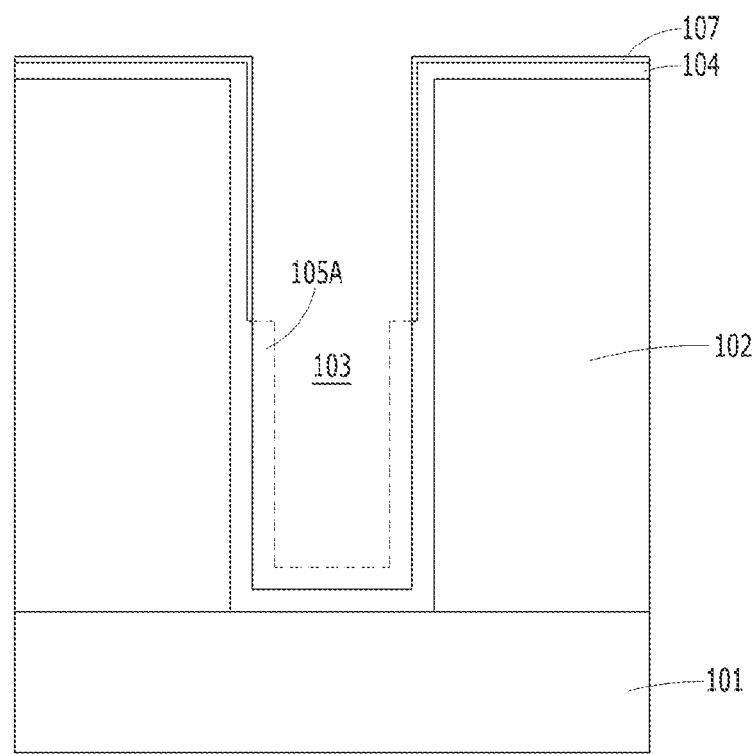
Figure 2E:
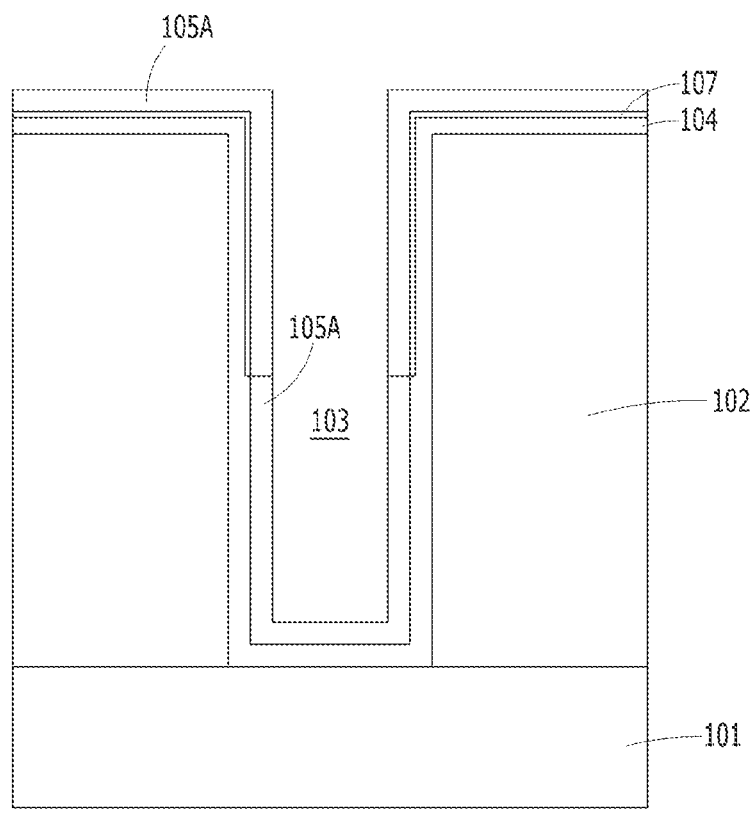

As illustrated in FIGS. 2D and 2E, a second liner layer 105A may be formed on the first liner layer 104. FIG. 2D illustrates an initial deposition state of the second liner layer 105A, and FIG. 2E illustrates a state after the deposition of the second liner layer 105A is completed.

Referring to FIGS. 2D and 2E, during an initial deposition process, the second liner layer 105A may be deposited on the first liner layer 104 at the middle and bottom of the opening 103. While the deposition process continues, the second liner layer 105A may be deposited on the first liner layer 104 and the fluorine adsorption layer 107 to cover the top corners of the opening 103.

After the deposition of the second liner layer 105A is completed, the second liner layer 105A may be conformally deposited without an overhang shape. The conformal deposition process of the second liner layer 105A may be performed because the deposition is partially suppressed by the fluorine adsorption layer 107. For example, the deposition rate of the second liner layer 105A at the top corners of the opening 103 may be smaller than the other portions. In other words, the deposition rate of the second liner layer 105A at the middle and the bottom of the opening 103 may be larger than the top corners of the opening 103.

As described above, because the deposition is suppressed by the fluorine adsorption layer 107 during the deposition process of the second liner layer 105A, the second liner layer 105A may be conformally deposited with a uniform thickness without an overhang shape.

Figure 2F:
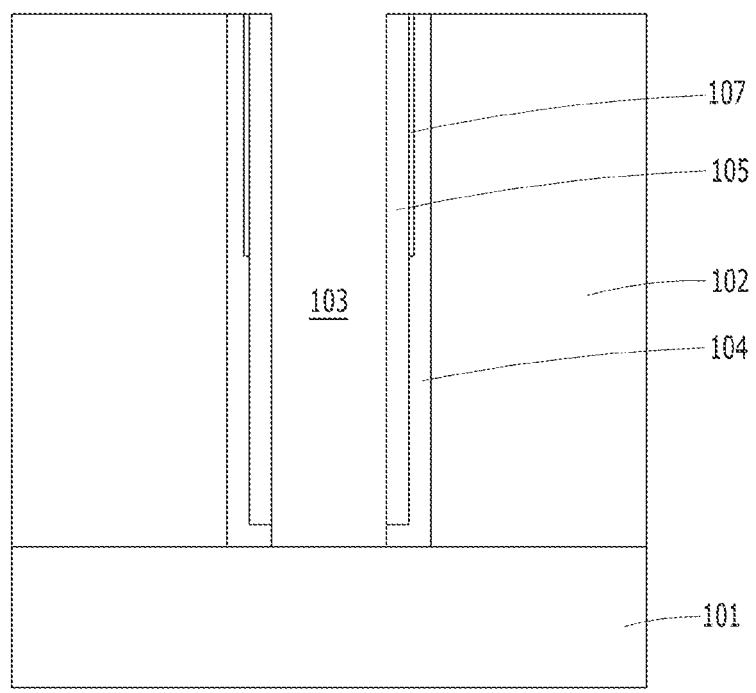

As illustrated in FIG. 2F, the bottom of the second liner layer 105A may be cut. As a result, a second liner layer 105 having a spacer shape may remain.

Continuously, the first liner layer 104 may be etched. Accordingly, the surface of the substrate 101 may be exposed, and the first liner layer 104 may remain to be located on the sidewalls of the opening 103.

The fluorine adsorption layer 107 may be located between the first liner layer 104 and the second liner layer 105 at the top corner or the top sidewall of the opening 103. The fluorine adsorption layer 107 might not be located at the middle and the bottom sidewalls of the opening 103.

Figure 2G:
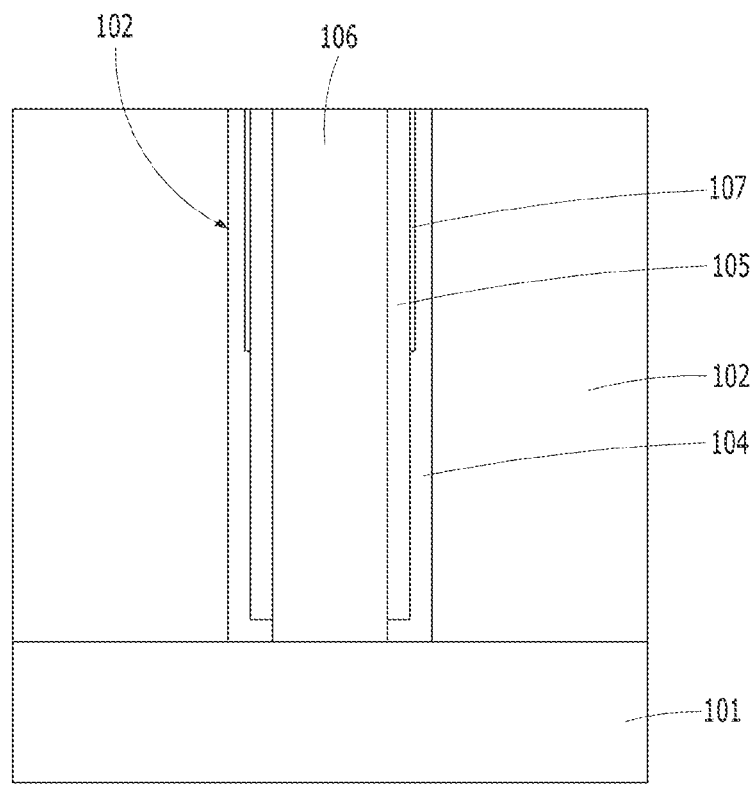

As illustrated in FIG. 2G, a filler 106 may be formed to fill the opening 103. The filler 106 may fully fill the opening 103 on the second liner layer 105.

To form the filler 106, deposition and planarization of a filler material may be performed to fill the opening 103 on the second liner layer 105.

The filler 106 may include oxide, a silicon layer, a high-k material, or combinations thereof. The filler 106 may include silicon oxide, a polysilicon layer, aluminum oxide or combinations thereof.

According to the above-described embodiment, the step coverage of the first liner layer 104 and the second liner layer 105 can be improved by the surface treatment 111.

Figure 3:
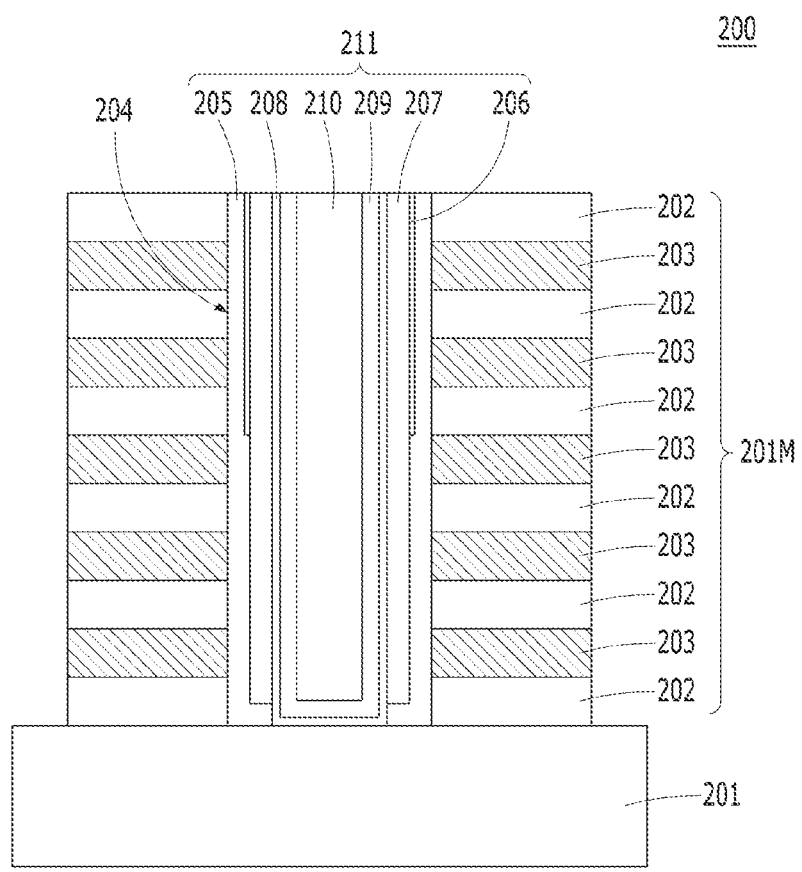
FIG. 3 is a cross-sectional view illustrating a vertical semiconductor device in accordance with an embodiment.

FIG. 3 is a cross-sectional view illustrating a vertical semiconductor device 200 in accordance with an embodiment.

Referring to FIG. 3, the vertical semiconductor device 200 may include a lower structure 201, an alternating stack 201M in which dielectric layers 202 and gate electrodes 203 are alternately stacked and a pillar structure 211 penetrating the alternating stack 201M. The pillar structure 211 may have a pillar shape of filling an opening 204 penetrating the alternating stack 201M. Each of the gate electrodes 203 may have a shape of surrounding the outer wall of the pillar structure 211.

The pillar structure 211 may include a blocking layer 205, a charge storage layer 207, a tunnel dielectric layer 208, a channel layer 209, and a core dielectric layer 210. The pillar structure 211 may further include an adsorption layer 206 formed at an interface between the blocking layer 205 and the charge storage layer 207. The blocking layer 205 may include oxide, and the charge storage layer 207 may include nitride. The tunnel dielectric layer 208 may include oxide, and the channel layer 209 may include a silicon layer. The core dielectric layer 210 may include oxide.

The adsorption layer 206 may include a material that induces conformal deposition of the blocking layer 205 and the charge storage layer 207. The adsorption layer 206 may include a deposition inhibitor. The deposition inhibitor may include fluorine. The adsorption layer 206 may include fluorine-adsorbed oxide or fluorine-adsorbed nitride. The adsorption layer 206 may include fluorine-adsorbed silicon oxide or fluorine-adsorbed silicon nitride.

In the present embodiment, when the blocking layer 205 and the charge storage layer 207 include silicon oxide and silicon nitride, respectively, the adsorption layer 206 may include fluorine-adsorbed silicon oxide. Herein, the adsorption layer 206 may induce conformal deposition of silicon nitride, which is the charge storage layer 207.

FIGS. 4A to 4K are cross-sectional views illustrating a method for fabricating a vertical semiconductor device in accordance with an embodiment.

Figure 4A:
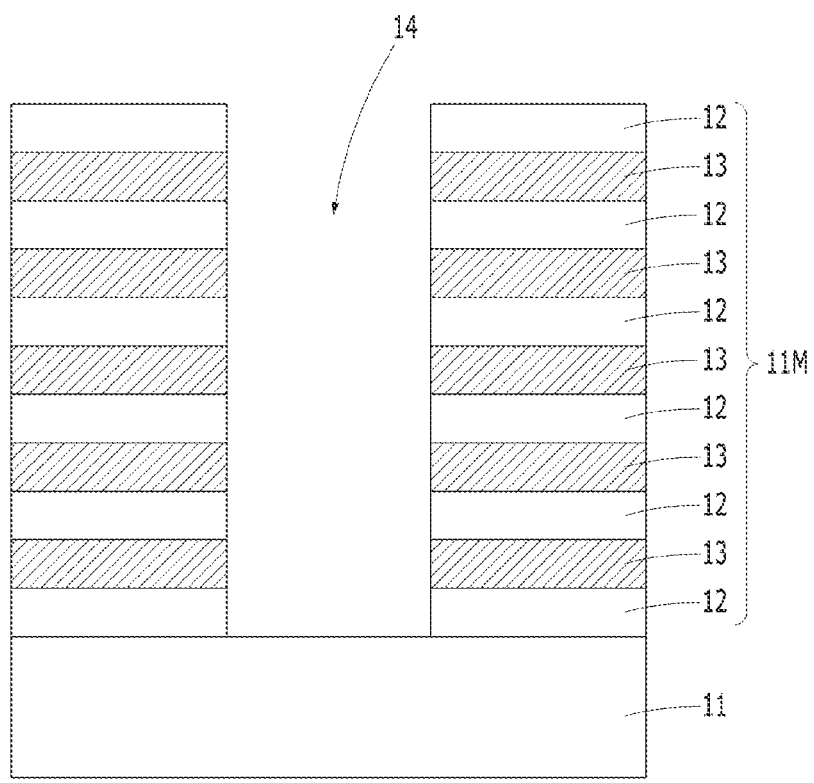
FIGS. 4A to 4K are cross-sectional views illustrating a method for fabricating a vertical semiconductor device in accordance with an embodiment.

As illustrated in FIG. 4A, an alternating stack 11M may be formed over a lower structure including a substrate 11. The substrate 11 may be a material suitable for semiconductor processing. The substrate 11 may include a semiconductor substrate. For example, the substrate 11 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, combinations thereof, or multi-layers thereof. The substrate 11 may include another semiconductor material, such as germanium. The substrate 11 may include a III/V-group semiconductor substrate, for example, a chemical compound semiconductor substrate such as a gallium arsenide (GaAs). The substrate 11 may include a Silicon-On-Insulator (SOI) substrate.

The alternating stack 11M may include a first material layer and a second material layer, which are sequentially formed. The first material layer may include a first material, and the second material layer may include a second material. The first material and the second material may be different from each other. The first material layer and the second material layer may include a dielectric layer 12 and a sacrificial layer 13, respectively. The dielectric layer 12 may include a dielectric material, and the sacrificial layer 13 may include a sacrificial material. Herein, the "sacrificial material" may refer to a material to be removed in a subsequent process. The dielectric layer 12 may include at least one dielectric material of silicon oxide, silicon nitride, silicon oxynitride, a spin-on dielectric material, dielectric metal oxide, silicate, and dielectric metal oxynitride.

The sacrificial layer 13 may include a sacrificial material that may be selectively removed with respect to the dielectric layer 12. The sacrificial layer 13 may be selectively removed with respect to the dielectric layer 12. The ratio of the removal rate of the sacrificial layer 13 to the removal rate of the dielectric layer 12 may be referred to as a selectivity of the removal process of the sacrificial layer 13 with respect to the dielectric layer 12.

The sacrificial layer 13 may include a dielectric material. The sacrificial layer 13 may be replaced with a conductive material in a subsequent process. For example, the sacrificial layer 13 may be replaced with a gate electrode or a word line of a vertical NAND device. The sacrificial layer 13 may include silicon nitride, amorphous silicon, or polysilicon. In some embodiments, the sacrificial layer 13 may include silicon nitride.

In the present embodiment, the dielectric layer 12 may include silicon oxide, and the sacrificial layer 13 may include silicon nitride.

The dielectric layer 12 may be deposited by chemical vapor deposition (CVD) or atomic layer deposition (ALD). The sacrificial layer 13 may be deposited by CVD or ALD.

The lowermost layer and the uppermost layer of the alternating stack 11M may be the dielectric layer 12. The dielectric layer 12 and the sacrificial layer 13 may have the same thickness.

Subsequently, an opening 14 may be formed in the alternating stack 11M. A part of the alternating stack 11M may be etched using a mask (not illustrated) to form the opening 14. The bottom of the opening 14 may expose the surface of the substrate 11. The opening 14 may include a vertical hole. A plurality of openings 14 may be arrayed. A plurality of openings 14 may be arranged in a zigzag. The plurality of openings 14 may have uniform sizes.

The sidewalls of the opening 14 may have vertical profiles. In some embodiments, the sidewalls of the opening 14 may have sloped profiles.

Figure 4B:
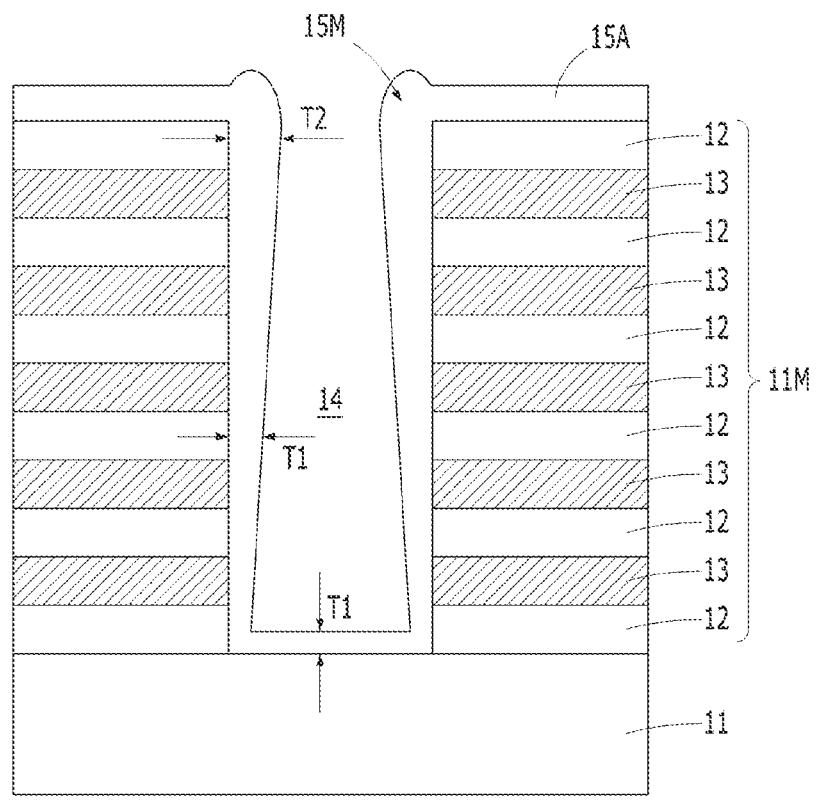

As illustrated in FIG. 4B, a blocking layer 15A may be formed. The blocking layer 15A may be non-conformally formed. In other words, the blocking layer 15A may have poor step coverage due to a high aspect ratio of the opening 14.

The blocking layer 15A may have different thicknesses, that is, a first thickness T1 formed on the sidewalls and the bottom of the opening 14 and a second thickness T2 formed at the top corners of the opening 14. For example, the second thickness T2 may be larger than the first thickness T1. Due to the thickness difference, an overhang shape 15M may be formed at the top corners of the opening 14.

The blocking layer 15A may include silicon oxide. In some embodiments, the blocking layer 15A may include aluminum oxide ($Al_2O_3$).

The silicon oxide as the blocking layer 15A may be deposited using a silicon source material and an oxygen-containing gas. As the silicon source material, $SiH_4$, HCDS ($Si_2Cl_6$), DCS($SiH_2Cl_2$), tris(dimethylamino) silane (TD-MAS), bis(diethylamino) silane (BDEAS), bis(tertiarybutylamino) silane (BTBAS), and the like may be used. As the oxygen-containing gas, $O_2$ may be used.

The silicon oxide as the blocking layer 15A may be formed by depositing silicon nitride and then oxidizing the silicon nitride. For example, $Si_3N_4$ may be formed using a silicon source material and an $NH_3$ gas, and then an oxidation process may be performed. The oxidation process may use an $H_2/O_2$ mixed gas.

In some embodiments, the silicon oxide as the blocking layer 15A may be deposited by ALD. The ALD may be performed on the silicon oxide, using a silicon source material and an oxygen-containing gas. As the oxygen-containing gas, an $H_2/O_2$ mixed gas may be used.

Figure 4C:
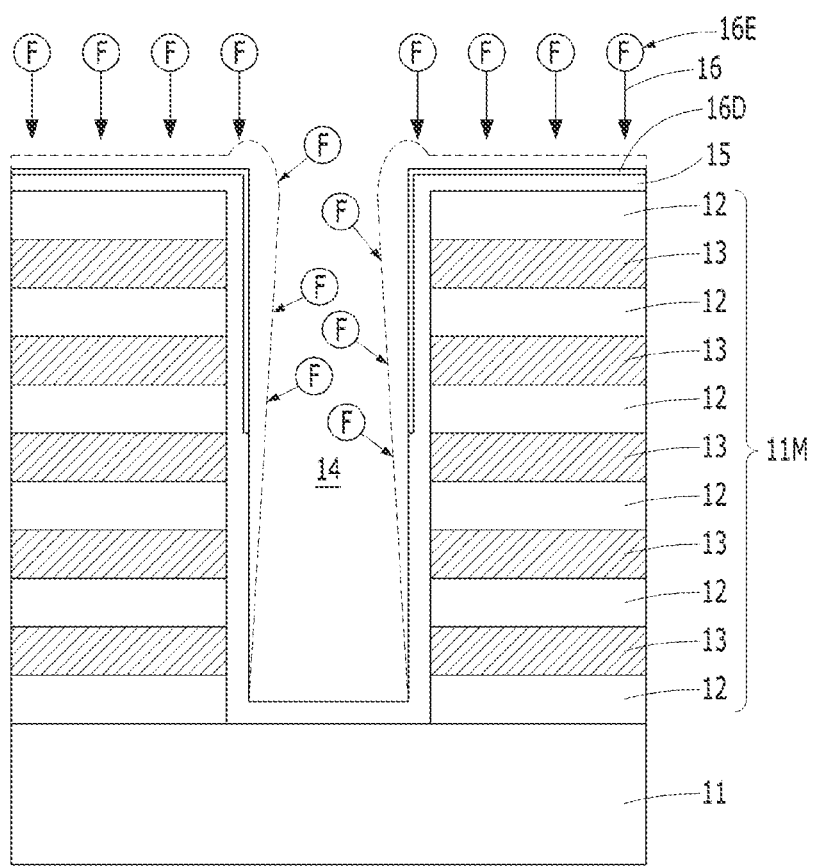

As illustrated in FIG. 4C, surface treatment 16 may be performed. The surface treatment 16 may include plasma treatment. The surface treatment 16 may convert the surface profile of the blocking layer 15A. For example, the surface treatment 16 may conformally convert the surface of the blocking layer 15A.

The surface treatment 16 may include an etch species 16E. The etch species 16E may include a material capable of partially etching the surface of the blocking layer 15A. The etch species 16E may include fluorine (F). The surface treatment 16 may include $NF_3$ plasma treatment. Accordingly, the surface treatment 16 may include fluorine plasma treatment.

As described above, the blocking layer 15A may be etched at the top corners or the top sidewalls of the opening 14 by the surface treatment 16 using fluorine plasma. In addition, the blocking layer 15A may be etched in the middle and bottom of the opening 14. At this time, the blocking layer 15A may be mainly etched at the top corners of the opening 14, and thus the overhang shape 15M may be removed.

Consequently, a blocking layer 15 having a uniform thickness may be formed by the surface treatment 16.

Fluorine of the fluorine plasma used during the surface treatment 16 may be adsorbed on the surface of the blocking layer 15. A fluorine adsorption layer 16D may be partially formed on the surface of the blocking layer 15. The fluorine adsorption layer 16D may serve as a deposition inhibitor in a subsequent process. The deposition inhibitor may be referred to as a "surface protector". The deposition inhibitor may include Cl, $N_2$, or HF other than fluorine.

Figure 4D:
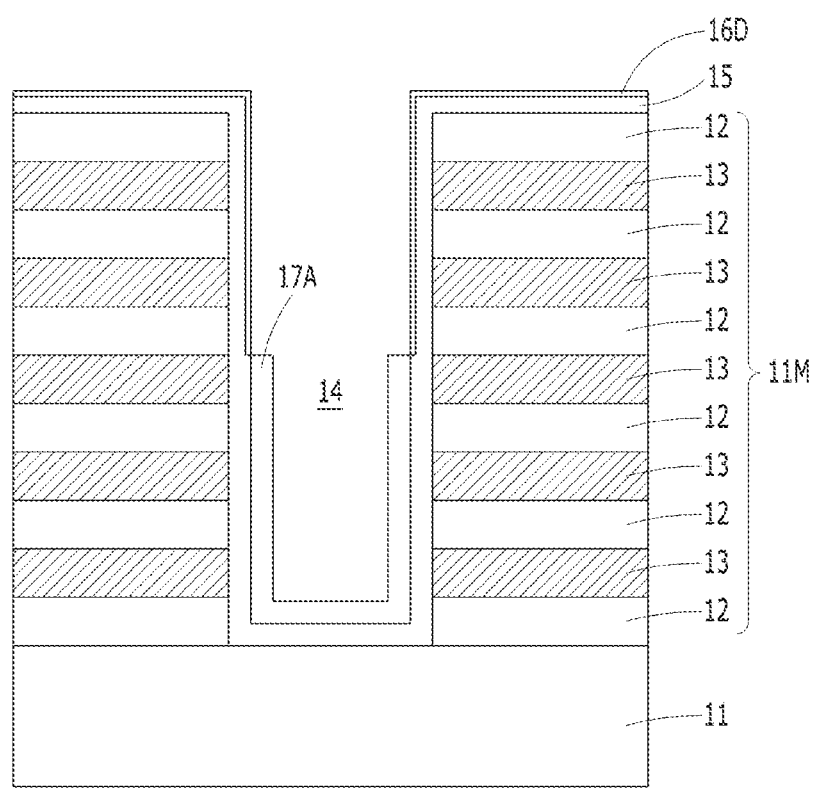
Figure 4E:
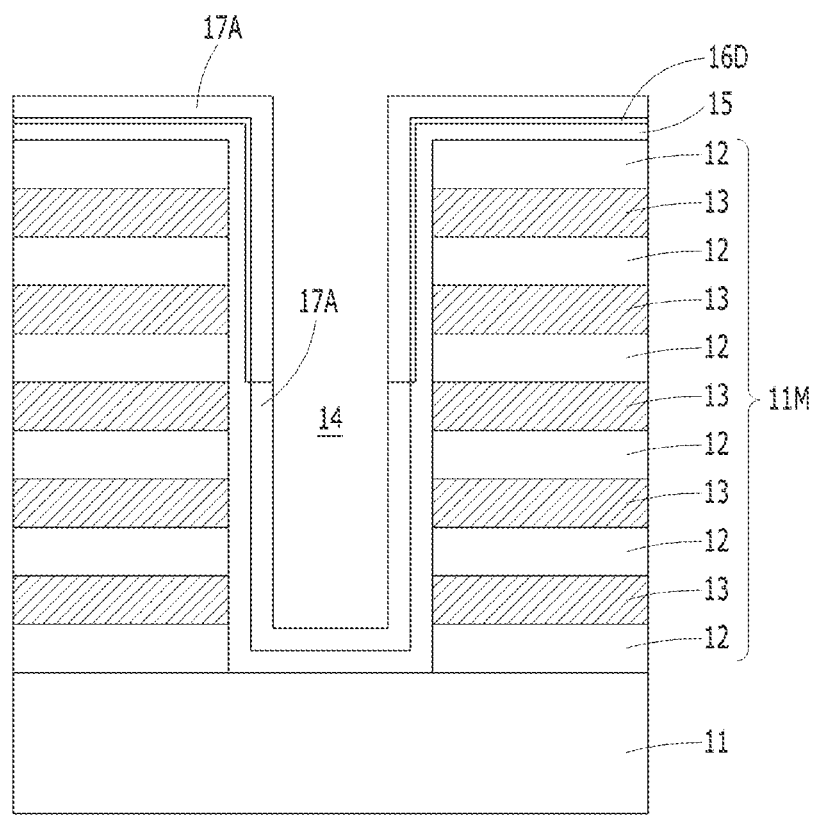

As illustrated in FIGS. 4D and 4E, a charge storage layer 17A may be formed on the blocking layer 15 and the adsorption layer 16D. The charge storage layer 17A may be formed on the surface of the blocking layer 15. Deposition of the charge storage layer 17A may be suppressed by the fluorine adsorption layer 16D. For example, the charge storage layer 17A might not be deposited at the top corners of the opening 14, and may be deposited at the middle and bottom of the opening 14.

The charge storage layer 17A may also be formed on the fluorine adsorption layer 16D by continuous deposition of the charge storage layer 17A. Thus, the charge storage layer 17A may be conformally deposited without an overhang shape.

As described above, because the deposition is suppressed by the fluorine adsorption layer 16D during the deposition process of the charge storage layer 17A, the charge storage layer 17A may be conformally deposited with a uniform thickness without an overhang shape.

Consequently, as the surface treatment 16 is performed, step coverage of both of the blocking layer 15 and the charge storage layer 17A may be improved.

Figure 4F:
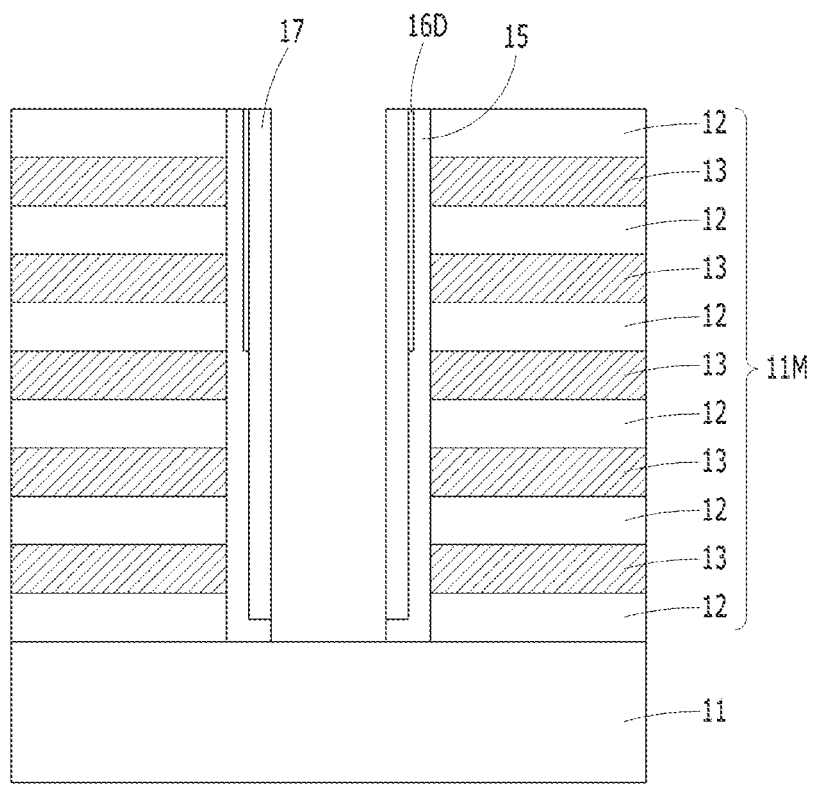

As illustrated in FIG. 4F, the bottom of the charge storage layer 17A may be cut. Accordingly, a charge storage layer 17 having a spacer shape may be formed.

Continuously, the bottom of the blocking layer 15 may be cut. The blocking layer 15 and the charge storage layer 17 may be formed on the sidewalls of the opening 14.

Figure 4G:
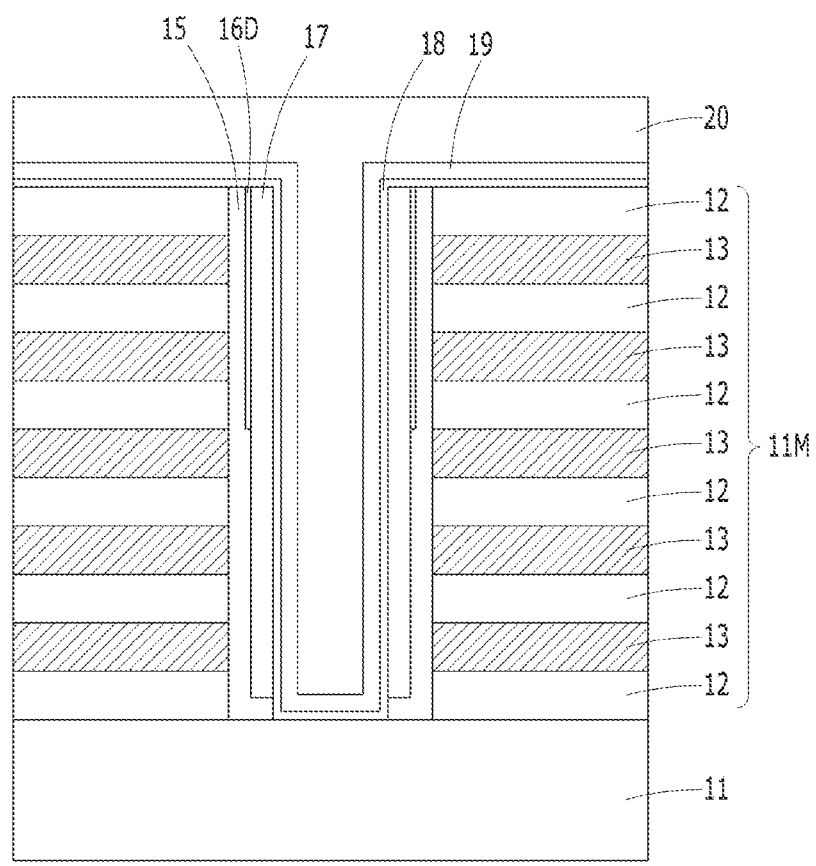

As illustrated in FIG. 4G, a tunnel dielectric layer 18 may be formed on the charge storage layer 17. The tunnel dielectric layer 18 may include silicon oxide.

A channel layer 19 may be formed on the tunnel dielectric layer 18, and a core dielectric layer 20 may be formed on the channel layer 19.

By a series of deposition processes described above, the opening 14 may be filled with the blocking layer 15, the charge storage layer 17, the tunnel dielectric layer 18, the channel layer 19, and the core dielectric layer 20.

The channel layer 19 may include a silicon layer. The channel layer 19 may include a doped silicon layer. The core dielectric layer 20 may include silicon oxide. In order to form the channel layer 19 and the core dielectric layer 20, the silicon layer and the silicon oxide may be sequentially formed, and then planarized. The channel layer 19 may have a cylindrical shape, and the core dielectric layer 20 may have a pillar shape of filling the cylinder of the channel layer 19.

Figure 4H:
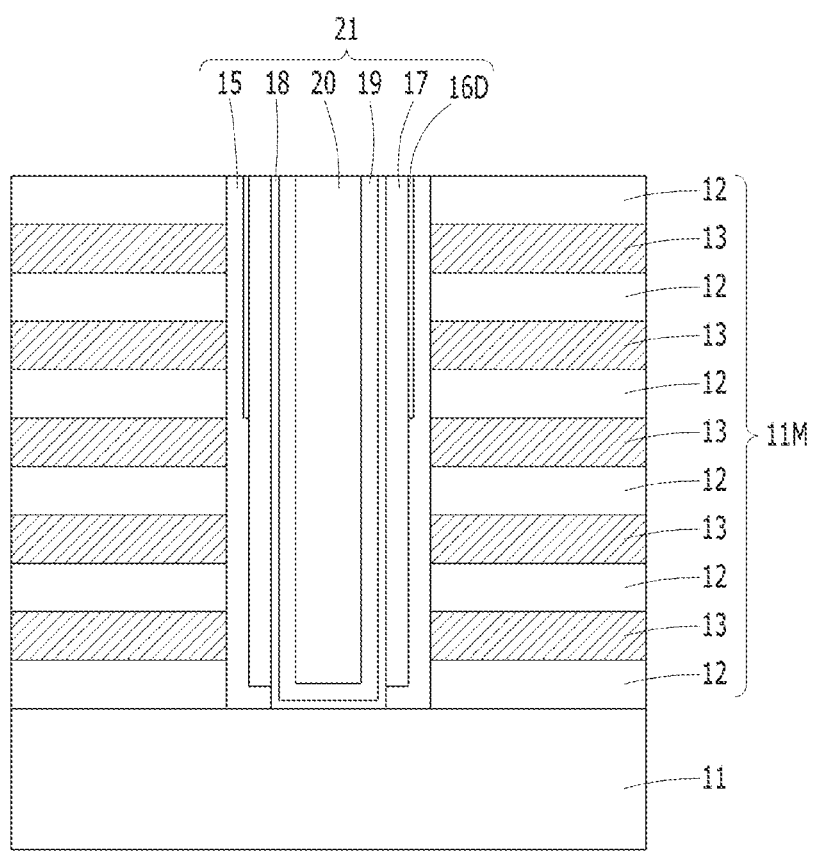

As illustrated in FIG. 4H, the core dielectric layer 20, the channel layer 19 and the tunnel dielectric layer 18 may be planarized. Accordingly, a pillar structure 21 may be formed in the opening 14. The pillar structure 21 may include the blocking layer 15 formed on the sidewalls of the opening 14, the charge storage layer 17 formed on the sidewall of the blocking layer 15, the tunnel dielectric layer 18 formed on the sidewall of the charge storage layer 17, the channel layer 19 formed on the sidewalls of the tunnel dielectric layer 18 and the core dielectric layer 20 formed on the sidewalls of the channel layer 19.

Figure 4I:
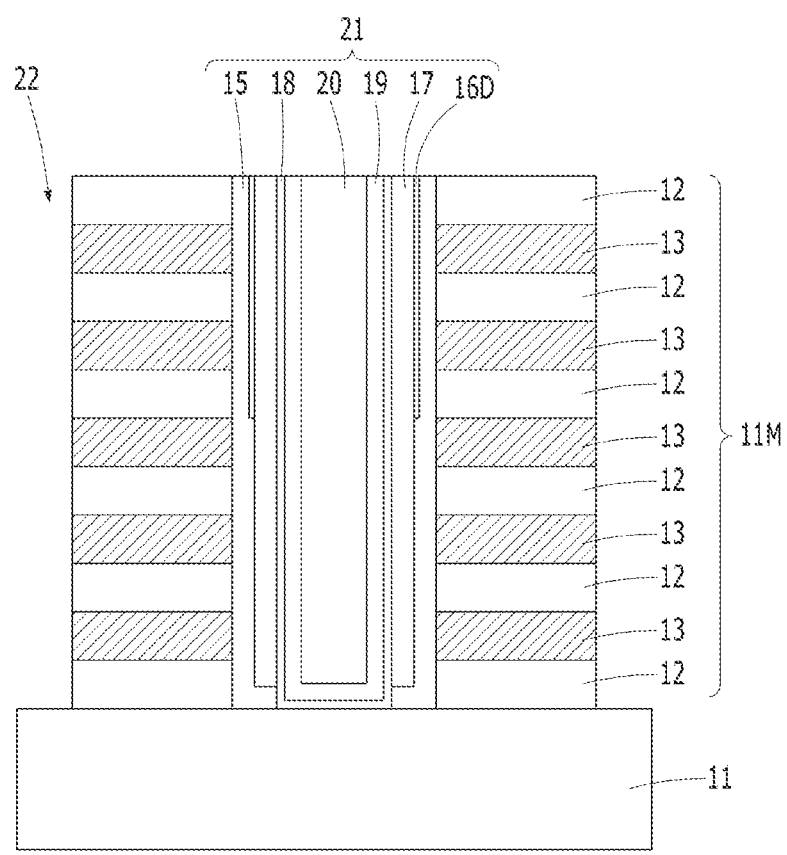

As illustrated in FIG. 4I, a slit 22 may be formed. To form the slit 22, a part of the alternating stack 11M may be etched. From a top view, the slit 22 may have a linear shape elongating in one direction.

Figure 4J:
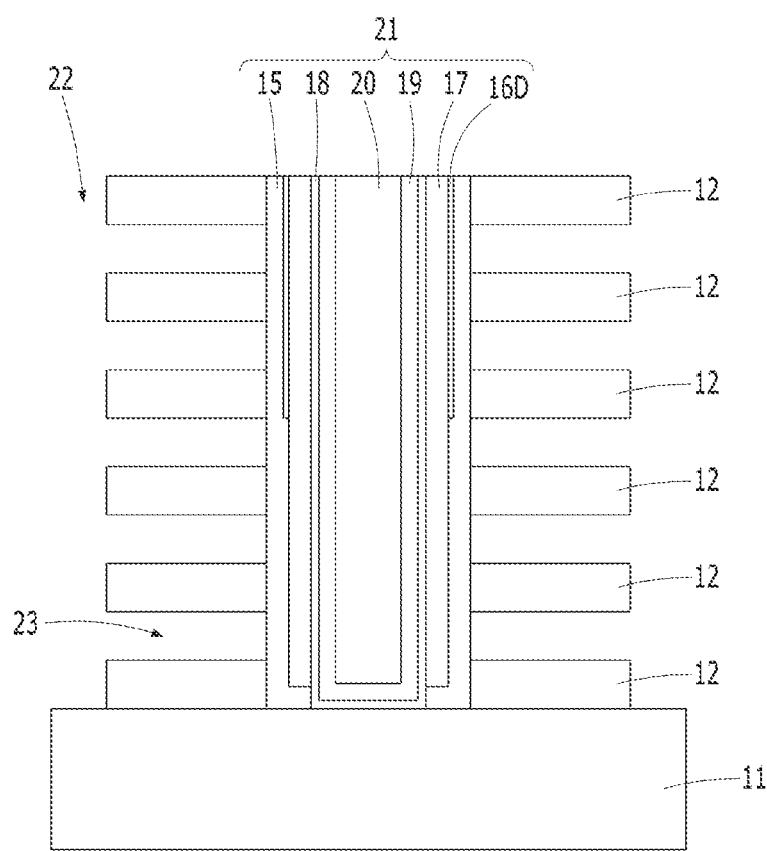

As illustrated in FIG. 4J, the sacrificial layer 13 may be selectively removed. Accordingly, a horizontal recess 23 may be formed between the dielectric layers 12. The horizontal recess 23 may partially expose the outer wall of the pillar structure 21.

Figure 4K:
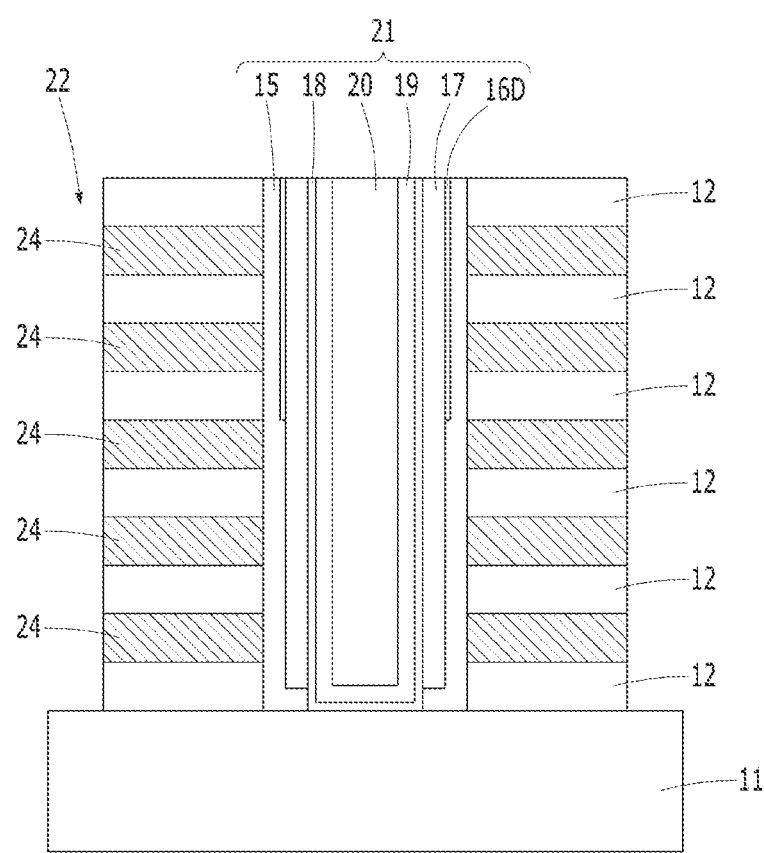

As illustrated in FIG. 4K, a gate electrode 24 may be formed to fill the horizontal recess 23. The gate electrode 24 may include a low resistance material. The gate electrode 24 may include a metal-based material. The gate electrode 24 may include a metal, metal silicide, metal nitride, or combinations thereof. For example, the metal may include nickel, cobalt, platinum, titanium, tantalum, or tungsten. The metal silicide may include nickel silicide, cobalt silicide, platinum silicide, titanium silicide, tantalum silicide or tungsten silicide. The gate electrode 24 may further include a barrier material (not illustrated). The barrier material may include metal nitride. For example, the barrier material may include titanium nitride (TiN).

In some embodiments, the surface treatment 16 may be performed after the charge storage layer 17A is deposited.

In some embodiments, the surface treatment 16 may be applied after at least one process of the deposition process of the blocking layer 15A, the deposition process of the charge storage layer 17A, the deposition process of the tunnel dielectric layer 18 and the deposition process of the channel layer 19.

In some embodiments, the surface treatment 16 may be selectively performed on the surface of the charge storage layer 17A after the blocking layer 15A and the charge storage layer 17A are sequentially deposited. In this case, the surface treatment 16 might not be performed after the deposition of the blocking layer 15A.

Figure 5A:
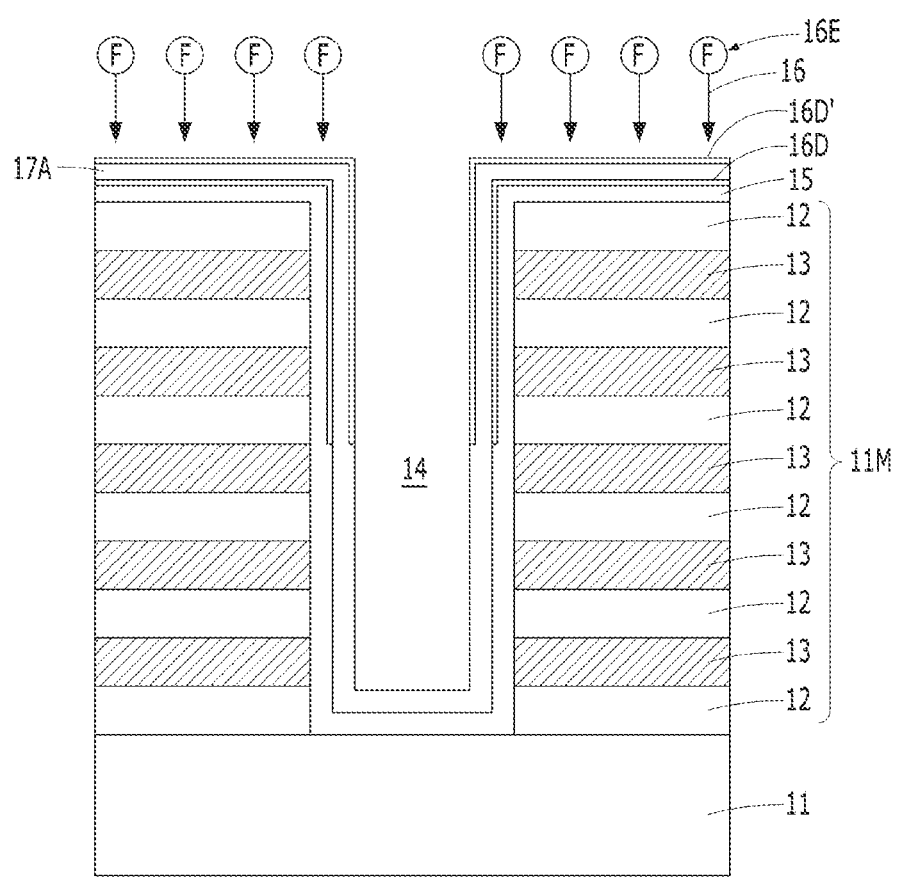
FIGS. 5A and 5B are cross-sectional views illustrating a method for fabricating a vertical semiconductor device in accordance with an embodiment.
Figure 5B:
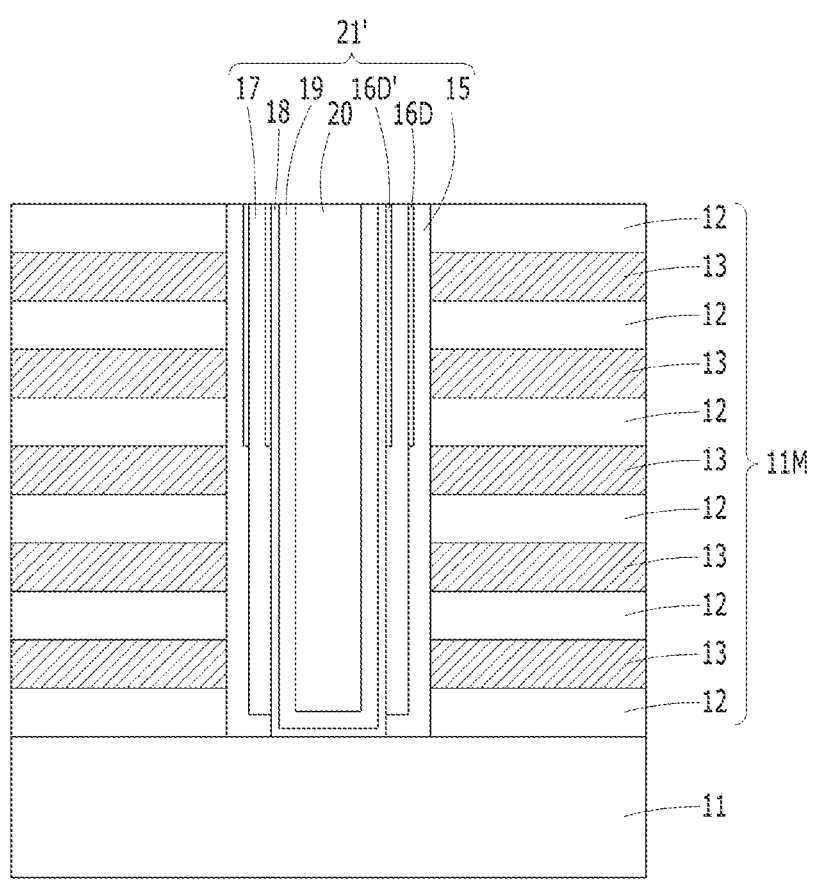

FIGS. 5A and 5B are cross-sectional views illustrating a method for fabricating a vertical semiconductor device in accordance with an embodiment.

A charge storage layer 17A may be conformally formed by the method illustrated in FIGS. 4A to 4E. A fluorine adsorption layer 16D may be formed between the charge storage layer 17A and a blocking layer 15.

Subsequently, as illustrated in FIG. 5A, surface treatment 16 may be performed again. The surface treatment 16 may include plasma treatment. The surface treatment 16 may convert the surface profile of the charge storage layer 17A. For example, the surface treatment 16 may conformally convert the surface of the charge storage layer 17A.

The surface treatment 16 may include an etch species 16E. The etch species 16E may include a material capable of partially etching the surface of the charge storage layer 17A. The etch species 16E may include fluorine (F). The surface treatment 16 may include $NF_3$ plasma treatment. Thus, the surface treatment 16 may include fluorine plasma treatment.

As described above, the charge storage layer 17A may be etched at the top corners or the top sidewalls of an opening 14 by the surface treatment 16 using fluorine plasma. In addition, the charge storage layer 17A may be etched in the middle and bottom of the opening 14. At this time, the charge storage layer 17A may be mainly etched at the top corners of the opening 14.

Consequently, the charge storage layer 17A having a uniform thickness may be formed by the surface treatment 16.

Fluorine of the fluorine plasma used during the surface treatment 16 may be adsorbed on the surface of the charge storage layer 17A. A fluorine adsorption layer 16D' may be partially formed on the surface of the charge storage layer 17A. The fluorine adsorption layer 16D' may reserve as a deposition inhibitor in a subsequent process. The deposition inhibitor may be referred to as a "surface protector". The deposition inhibitors may include Cl, $N_2$, or HF other than fluorine.

The fluorine adsorption layer 16D' may be fluorine-adsorbed silicon nitride. The fluorine adsorption layer 16D' may be fluorine-adsorbed silicon oxide.

Subsequently, a series of processes illustrated in FIGS. 4G to 4J may be performed. For example, after the charge storage layer 17A on which the fluorine adsorption layer 16D' has been formed is cut, the blocking layer 15 may be cut. Continuously, a tunnel dielectric layer 18, a channel layer 19, and a core dielectric layer 20 may be sequentially deposited.

Accordingly, as illustrated in FIG. 5B, a pillar structure 21' may be formed to fill the opening 14. The pillar structure 21' may include the blocking layer 15 formed on the sidewalls of the opening 14, a charge storage layer 17 formed on the sidewall of the blocking layer 15, the tunnel dielectric layer 18 formed on the sidewall of the charge storage layer 17, the channel layer 19 formed on the sidewalls of the tunnel dielectric layer 18, and the core dielectric layer 20 formed on the sidewalls of the channel layer 19. The pillar structure 21' may further include the fluorine adsorption layers 16D and 16D'. The fluorine adsorption layer 16D may be located between the blocking layer 15 and the charge storage layer 17. The fluorine adsorption layer 16D' may be located between the charge storage layer 17 and the tunnel dielectric layer 18.

The tunnel dielectric layer 18 may be conformally deposited with a uniform thickness without an overhang shape by the fluorine adsorption layer 16D'. Consequently, as the surface treatment 16 is performed twice, step coverage of all of the blocking layer 15, the charge storage layer 17, and the tunnel dielectric layer 18 may be improved.

Subsequently, a gate electrode illustrated in FIG. 4K may be formed.

Figure 6:
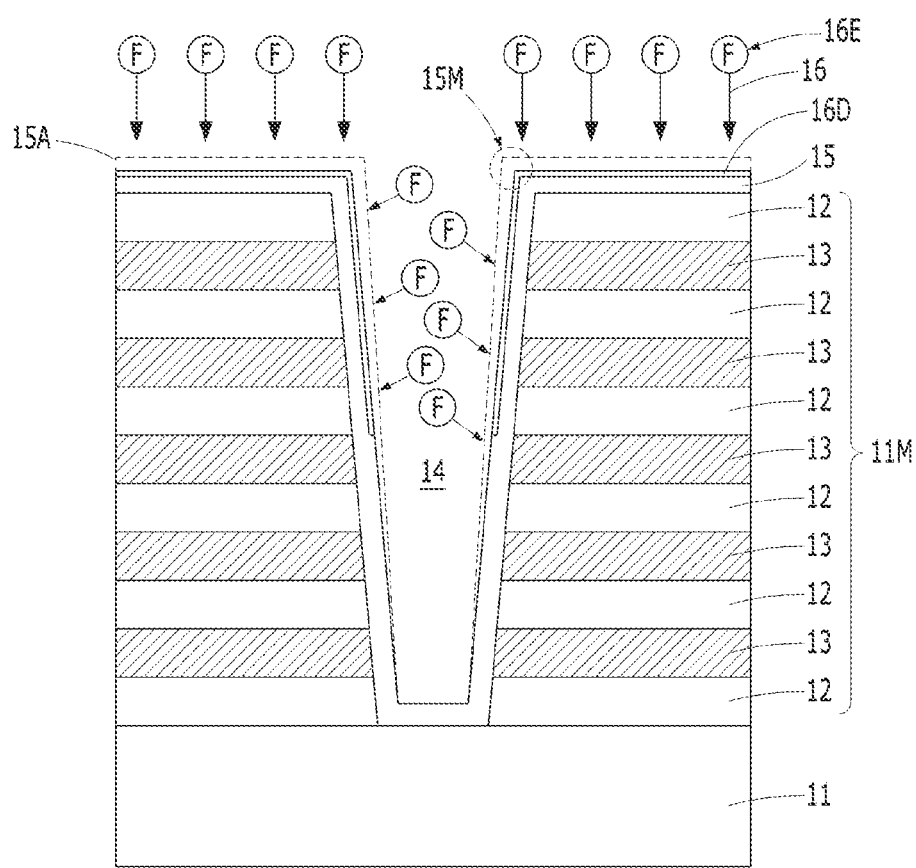
FIG. 6 is a cross-sectional view illustrating a method for fabricating a vertical semiconductor device in accordance with an embodiment.

FIG. 6 is a cross-sectional view illustrating a method for fabricating a vertical semiconductor device in accordance with an embodiment. FIG. 6 illustrates an opening 14 with sloped sidewalls, and another example of the surface treatment 16 for the blocking layer 15A of FIG. 4B.

Referring to FIG. 6, surface treatment 16 may be performed. The surface treatment 16 may include plasma treatment. The surface treatment 16 may convert the surface profile of a blocking layer 15A. For example, the surface treatment 16 may conformally convert the surface of the blocking layer 15A.

The surface treatment 16 may include an etch species 16E. The etch species 16E may include a material capable of partially etching the surface of the blocking layer 15A. The etch species 16E may include fluorine (F). The surface treatment 16 may include $NF_3$ plasma treatment. Thus, the surface treatment 16 may include fluorine plasma treatment.

As described above, the blocking layer 15A may be etched at the top corners or the sidewalls of the opening 14 by the surface treatment 16 using fluorine plasma. In addition, the blocking layer 15A may be etched in the middle and bottom of the opening 14. At this time, the blocking layer 15A may be mainly etched at the top corners of the opening 14, and thus an overhang shape 15M may be removed.

Consequently, a blocking layer 15 having a uniform thickness may be formed by the surface treatment 16.

Fluorine of the fluorine plasma used during the surface treatment 16 may be adsorbed on the surface of the blocking layer 15. A fluorine adsorption layer 16D may be partially formed on the surface of the blocking layer 15. The fluorine adsorption layer 16D may serve as a deposition inhibitor in a subsequent process. The deposition inhibitor may be referred to as a "surface protector". The deposition inhibitor may include Cl, $N_2$ or HF other than fluorine.

According to the above-described embodiments, the process of forming the stack of the blocking layer 15, the charge storage layer 17, and the tunnel dielectric layer 18 may be referred to as an "ONO process".

As a comparative example, when the ONO process is performed to deposit the layers in the manner of thermal atomic layer deposition (ALD), it may be exposed to a high temperature of 630° C. or higher. A minute chemical vapor deposition (CVD) reaction attributable to such a high-temperature process causes step coverage deterioration in which non-conformal deposition is performed. In other words, because the upper side of the opening 14 is deposited to be relatively thicker than the lower side of the opening 14, the step coverage may deteriorate.

According to the present embodiments, in order to improve the step coverage of the ONO process, the surface treatment 16 may be performed to realize both an etch effect and a deposition suppression effect at the same time, before the charge storage layer 17A is deposited. The surface treatment 16 may use $NF_3$ plasma, and when the $NF_3$ plasma flows to the upper side of the opening 14, and then the charge storage layer 17A is deposited, the step coverage of the blocking layer 15 may be improved while the upper portion of the blocking layer 15 is etched.

In addition, because the upper side of the charge storage layer 17 is not deposited at the initial deposition stage due to the fluorine adsorption layer 16D, the step coverage of both of the blocking layer and the charge storage layer may be improved.

According to some embodiments, a surface treatment including an etch species and a deposition inhibitor is performed, thereby gap-filling an opening having a high aspect ratio.

According to some embodiments, a surface treatment including an etch species and a deposition inhibitor is performed when an oxide-nitride-oxide (ONO) stack is formed, thereby improving step coverage of the ONO stack.

While the present teachings have been described with respect to a limited number of possible embodiments, it should be noted that the presented embodiments are for describing, not limiting, the present teachings. Further, it should be noted that the present teachings may be achieved in various ways through substitution, change, and modification, by those skilled in the art without departing from the scope of the present teachings as defined by the following claims.

What is claimed is:

1. A method for fabricating a vertical semiconductor device comprising:
   forming an alternating stack of dielectric layers and sacrificial layers over a lower structure;
   forming an opening by etching the alternating stack;
   forming a blocking layer on the alternating stack in which the opening is formed;
   performing a surface treatment to adsorb a deposition inhibitor on a surface of the blocking layer;
   forming a charge storage layer on the blocking layer which the deposition inhibitor is adsorbed;
   forming a tunnel dielectric layer on the charge storage layer;
   forming a channel layer on the tunnel dielectric layer;
   forming a slit in the alternating stack; and
   replacing the sacrificial layers with gate electrodes through the slit.

2. The method of claim 1, wherein the surface treatment comprises a plasma treatment.

3. The method of claim 1, wherein the surface treatment is concentrated on a top corner of the opening.

4. The method of claim 1, wherein the surface treatment comprises partially etching the blocking layer at a top corner of the opening.

5. The method of claim 1, wherein the surface treatment is performed by plasma treatment comprising a plasma including an etch species.

6. The method of claim 1, wherein the deposition inhibitor comprises a plasma including fluorine.

7. The method of claim 1, wherein the deposition inhibitor comprises a plasma including nitrogen trifluoride $NF_3$.

8. The method of claim 1, wherein the deposition inhibitor comprises fluorine F, chlorine Cl, nitrogen $N_2$ or hydrogen fluoride HF.

9. A method for fabricating a vertical semiconductor device comprising:
   forming an alternating stack of dielectric layers and sacrificial layers over a lower structure;
   forming an opening by etching the alternating stack;
   forming a blocking layer on the alternating stack in which the opening is formed;
   performing a first surface treatment to adsorb a first deposition inhibitor on a surface of the blocking layer;
   forming a charge storage layer on the blocking layer on which the first deposition inhibitor is adsorbed; and
   performing a second surface treatment to adsorb a second deposition inhibitor on a surface of the charge storage layer;
   forming a tunnel dielectric layer on the charge storage layer on which the second deposition inhibitor is adsorbed;
   forming a channel layer on the tunnel dielectric layer;
   forming a slit in the alternating stack; and
   replacing the sacrificial layers with gate electrodes through the slit.

10. The method of claim 9, wherein the first surface treatment comprises performing a plasma treatment.

11. The method of claim 9, wherein the first surface treatment is concentrated on a top corner of the opening.

12. The method of claim 9, wherein the first surface treatment comprises partially etching the blocking layer at a top corner of the opening.

13. The method of claim 9, wherein the first surface treatment comprising a plasma including an etch species.

14. The method of claim 9, wherein the first deposition inhibitor comprises a plasma including fluorine.

15. The method of claim 9, wherein the first deposition inhibitor comprises a plasma including nitrogen trifluoride $NF_3$.

16. The method of claim 9, wherein the first deposition inhibitor comprises fluorine F, chlorine Cl, nitrogen $N_2$ or hydrogen fluoride HF.

17. The method of claim 9, wherein the blocking layer comprises silicon oxide or aluminum oxide.

18. The method of claim 9, wherein the first deposition inhibitor and the second deposition inhibitor comprise the same material of a plasma.

19. The method of claim 9, wherein the first deposition inhibitor and the second deposition inhibitor comprise fluorine F, chlorine Cl, nitrogen $N_2$ or hydrogen fluoride HF.

20. The method of claim 9, wherein replacing the sacrificial layers with gate electrodes through the slit comprises:
   removing the sacrificial layers to form horizontal recesses between the dielectric layers; and
   forming the gate electrodes in the horizontal recess, respectively.

* * * * *